(12) United States Patent
Whillock et al.

(10) Patent No.: US 9,281,838 B1
(45) Date of Patent: Mar. 8, 2016

(54) COMMON COPY COMPRESSION (71) Applicant: ADOBE SYSTEMS INCORPORATED, San Jose, CA (US)

(72) Inventors: Asa Whillock, San Francisco, CA (US); Viswanathan Swaminathan, Saratoga, CA (US)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 0 days.

(21) Appl. No.: 14/619,173

(22) Filed: Feb. 11, 2015

Related U.S. Application Data (63) Continuation of application No. 14/470,593, filed on Aug. 27, 2014.

(51) Int. Cl.
*H03M 7/00* (2006.01)
*H03M 7/30* (2006.01)

(52) U.S. Cl.
CPC .......... *H03M 7/3086* (2013.01); *H03M 7/3084* (2013.01)

(58) Field of Classification Search
CPC ... H03M 7/3086; H03M 7/3084; H03M 7/40; H03M 7/3053; H03M 7/42; H03M 7/46
USPC ................. 341/50, 65, 67, 106, 107
See application file for complete search history.

(56) References Cited

U.S. PATENT DOCUMENTS

| | | | | |
|---|---|---|---|---|
| 5,488,365 A | * | 1/1996 | Seroussi .................. | G06T 9/005 341/106 |
| 5,563,593 A | * | 10/1996 | Puri ............................... | 341/67 |
| 5,717,951 A | * | 2/1998 | Yabumoto ............. | G06F 3/0619 707/999.1 |
| 6,421,467 B1 | * | 7/2002 | Mitra .................... | G06K 9/6222 382/240 |
| 2003/0103667 A1 | * | 6/2003 | Soliman ............... | G06K 9/6223 382/157 |
| 2004/0001408 A1 | * | 1/2004 | Propps ............... | G11B 20/1883 369/53.17 |
| 2005/0071744 A1 | * | 3/2005 | Dunbar .................. | G11B 20/12 715/200 |
| 2005/0114290 A1 | * | 5/2005 | Borthakur ................. | G06F 7/02 |
| 2005/0132161 A1 | * | 6/2005 | Makela ................. | G06F 12/023 711/170 |
| 2008/0031601 A1 | * | 2/2008 | Hashimoto ............ | G11B 20/10 386/336 |
| 2010/0138396 A1 | * | 6/2010 | Kikkawa ............... | G06F 3/0608 707/674 |
| 2014/0258652 A1 | * | 9/2014 | Vishniac ............... | G06F 3/0608 711/159 |

OTHER PUBLICATIONS

Non-Final Office Action dated Jul. 16, 2015 in U.S. Appl. No. 14/470,593, 17 pages.

* cited by examiner

*Primary Examiner* — Linh Nguyen
(74) *Attorney, Agent, or Firm* — Shook, Hardy & Bacon, LLP (57) ABSTRACT

Embodiments of the present invention provide systems, methods, and computer storage media directed to hosting a plurality of copies of a digital content. A common component and one or more individual components from one or more copies of the digital content are generated. As such, the common component and the one or more individual components are stored, such that each individual component in conjunction with the common component represents a separate copy of the digital content. In some implementations, a compression ratio may be customized for determining the sizing of the common component and individual component.

18 Claims, 9 Drawing Sheets

COMMON COPY COMPRESSION

CROSS-REFERENCE TO RELATED APPLICATIONS

This application is a continuation of and claims priority from U.S. application Ser. No. 14/470,593, filed Aug. 27, 2014, entitled "Common Copy Compression," which is assigned or under obligation of assignment to the same entity as this application, the entire contents of each application being herein incorporated by reference.

BACKGROUND

Consumer access to digital media has progressively moved towards server-based storage solutions, otherwise known as the "cloud." Consumers benefit from having a single access point for storing and accessing digital media because they are no longer required to maintain separate copies of the digital media over multiple devices. Cloud service providers, however, must maintain and distribute a separate copy of a common digital media for each licensed consumer. Providers now face the challenge of meeting the ever-increasing storage demands of consumers, while staying within the parameters of copyright laws and digital media licensing requirements.

SUMMARY

Embodiments of the present invention relate to hosting copies of a digital content. In one embodiment, a plurality of unique but substantially similar copies of a digital content are hosted. A common component, containing a portion of digital content that is common to the plurality of unique but substantially similar copies of the digital content, and a plurality of individual components each containing a unique portion of the digital content, are extracted from the plurality of unique but substantially similar copies of the digital content. The common component and plurality of individual components are stored instead of storing the plurality of unique but substantially similar copies of the digital content, so as to reduce hosting storage space requirements.

In another embodiment, a common component and an individual component from one or more copies of the digital content is generated. The common component and a plurality of copies of the individual component are then stored, with each copy of the individual component in conjunction with the common component representing a copy of the digital content. In some implementations, a compression ratio is determined for the copies of the digital content. The compression ratio may affect the size of the common component and/or the individual component. In some instances, the generation of a common component during compression can produce residual errors. Depending on the compression ratio, the residual errors may be stored as a single residual component to be shared by each copy of the individual component for reconstruction of the digital content, or stored as a plurality of copies of the residual component, each copy of the residual component corresponding to a copy of the individual component for reconstruction of the digital content.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein.

DETAILED DESCRIPTION

Various terms are used throughout this description. Although more details regarding various terms are provided throughout this description, general definitions of some terms are included below to provider a clearer understanding of the ideas disclosed herein:

As used herein, a "digital content" generally refers to an electronic data file. In some cases, a digital content can be a video file, audio file, or any other digital media file. In other cases, a digital content can be a data file, application, game, or any other digital data file. The digital content can be a particular presentation commonly licensed or owned by a plurality of users. For instance, the digital content can be a digital recording of a particular television show. In other instances, the digital content can be one of a plurality of digital recordings of the same television show, each digital recording being recorded and licensed by a unique user. In such cases, each of the digital recordings comprise substantially similar content, while maintaining unique identifying elements (e.g., user id, source information, total length, start time, end time, metadata, etc.). In some cases, substantially similar digital recordings of the same presentation may share anywhere from about 60% to about 100% common content. As such, when hosting multiple copies of a digital content, embodiments may pertain to multiple copies that are either identical to each other or substantially similar. When hosting substantially similar but unique copies, a majority of the digital content data is identical or "common", while the remaining data is unique to each individual copy.

A "component" generally refers to a portion of digital content data. In some cases, a component can be a "common component," which is the counterpart to an "individual component." In one embodiment, the common component can comprise a common portion of the digital content data, where the digital content data is the portion of digital content that is identical in each unique but substantially similar copy of the digital content. In other embodiments, the common component can comprise the portion of data that is common to and shared by all individual components for decoding and/or recreating the digital content (e.g., a codebook for decoding). In other cases, a component can be an individual component, which is the counterpart to a common component. In one embodiment, the individual component can be comprised of a unique portion of digital content data specific to the unique copy from which the individual component originated. In other words, the unique portion of the digital content data corresponds to one of a plurality of unique but substantially similar copies of a digital content. In other embodiments, the individual component can be comprised of one or more index files, with each index file representing a separate and unique copy of the digital content for each user. Each index file must use at least the shared common component (e.g., a codebook) for decoding and/or recreation of the digital content.

As used herein, "common copy compression" refers to a process of breaking down one or more digital content data files into a common component and individual components. Both common and individual components are smaller than the data file from which they were created. As described herein, the common component is a single data portion that is common to and shared by all individual components, whereas the individual components are separate portions that represent unique and separate copies of the digital content. In some aspects, each unique but substantially similar copy of a digital content will share a common component and have a separate individual component corresponding to and representing the unique and separate copy. In some other aspects, a compression algorithm is used for encoding or mapping digital content input vectors into a common component and a plurality of individual components, with each copy of the index file being generated and stored for each user. As described herein, each user's individual copy can maintain a reduced form of the original content. A compression algorithm may utilize, for example, vector quantization, which is based on a motivation of dimensionality reduction or data compression.

A "compression ratio" generally refers to a value for determining the amount of compression applied to the digital content data file. The compression ratio can be a value that is predetermined, input by an administrator, or calculated by the computing device. The compression ratio can affect the size of the encoded common component and/or individual components produced by the common copy compression algorithm. The compression ratio can be a value, percentage, or fraction representative of an amount of compression to-be-performed by the computing device. For example, the compression ratio can be a number on a compression scale of 1 to 10, with 1 being minimal compression resulting in a small common component and large individual components, and 10 being maximum compression resulting in a large common component and small individual components. Similarly, compression ratios can be represented by percentage scales of 0% to 100% or a fractional scale of 0/1 to 1/1.

"Vector quantization," as described herein, is a process of compressing a digital content data file into smaller data portions. More particularly, the process encodes a large set of input vectors by finding a smaller set of representative codebook vectors for providing an approximation to the original input space. In some cases, representative codebook vectors can be determined using a nearest neighbor condition, wherein the encoding region should consist of all vectors that are closer to a particular codebook vector than any other codebook vector. In other cases, representative codebook vectors can be determined using a centroid condition, wherein a particular codebook vector should be the average of all vectors that are in an encoding region.

A "codebook" generally refers to a set of parameters used to decode data. In more detail, the codebook is collection of representative codebook vectors, also known as codewords. A codeword refers to a codebook vector determined to be the closest vector in Euclidean distance from the input vector. The codebook can be used to represent the portion of the digital content that is common to a plurality of index files. As will be described, the codebook can be used with a corresponding index file for decoding and reconstructing the digital content.

An "index file" generally refers to a collection of indices for referencing the codebook. In more detail, the index file includes codeword indices that offer the lowest amount of distortion. The index file can be used to represent a single unique copy of the digital content. As will be described, the index file is used with the common component for decoding and reconstructing the digital content.

A "residual error" refers to portions of the digital content input vectors that potentially may not be stored in the codebook as a result of input vector decomposition during vector quantization. As will be described herein, residual errors can still be used with a codebook and an index file for decoding and reconstructing the digital content. Residual errors, as referenced herein, are generally produced as a result of encoding digital content using lossy compression schemes, such as vector quantization.

As used herein, the "cloud" refers to a wide area network (WAN) commonly depicted as a cloud, often referring to the Internet, and more precisely to some datacenter full of servers connected thereto. In some cases, the cloud can be the Internet, a local area network (LAN), a wide area network (WAN), or any combination thereof.

As used herein, "encoding" is the process of applying a specific code or algorithm to data for conversion into an equivalent cipher. In some cases, the process of encoding can include generating smaller identifiable components from a digital content data file. The components can be individually unique and/or commonly used by other components. In other cases, encoding can include parsing or extracting a common data portion and a plurality of unique data portions (also referred to herein as "extracting"), both the common and unique data portions being smaller in size than the original data file. In some other cases, encoding can also parse out or extract a residual data portion.

On the other hand, "decoding" is the reverse process of encoding. Decoding converts encoded data communication transmissions and files back to their original states. In other words, the process of decoding reconstructs a data file by merging together smaller identifiable portions (also referred to herein as "reconstructing"). The portions from which the data file is reconstructed can be individually unique and/or commonly used by other portions.

As used herein, "compression" refers to the process of modifying, encoding or converting the bits structure of data in such a way that it consumes less space on disk. In some cases, compression can be lossless, such that no information is discarded as a result of the compression algorithm used for encoding. In other cases, compression can be lossy, such that the algorithm can look for recurring patterns in a data file and replace occurrences of the recurring pattern portions with short abbreviations, thereby reducing the file size.

As used herein, "extracting" refers to the process of separating portions of data from a plurality of unique but substantially similar copies of digital content based on similarities and/or differences between each copy. In some aspects, extraction can be performed by comparing each copy to one another to determine the commonalities between one another, followed by dissecting the common portion from each copy, thereby determining and creating the common component. As such, the remaining portions from each copy remain as the individual components. In some other aspects, extraction can be performed by recursive algorithms, which extract and build portions of individual components as copies of digital content are compared to one another. As such, after recursively traversing through each copy, a common component will ultimately form as a result of the comparison and extraction process. Other algorithms and processes for extracting common and individual components are considered within the scope of the invention.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

As digital data storage moves aggressively toward server-based "cloud" solutions, local storage becomes increasingly less significant. A local storage solution, such as a hard drive that is physically close to one's person, presents the user with a variety of restrictions that are overcome by cloud-based storage solutions. For example, if a user creates a document on their local computing device and saves the document onto the hard drive therein, to access that document at a later time the user must save that document to a portable storage solution for access by another computing device, or make that document accessible by email or other network-enabled sharing solution. Cloud-based solutions provide the user with a simplified experience by allowing the user to save directly to the cloud and access the same document from another cloud-accessible device.

Digital media service providers have harnessed the benefits of cloud-based storage solutions for providing consumers with single point-of-access storage solutions for accessing digital content. Oftentimes, cloud-based digital media solutions such as cloud-based television, digital video recording (DVR), movie rental, radio, podcasts, etc., all provide multiple users access to a common digital content. Licensing agreements and copyright laws require service providers to host individual copies of a digital content for each user that is licensed to access the digital content. In other words, if a number of users are licensed to view a digitally recorded copy of a television show stored on the cloud, laws require the cloud servers to maintain unique copies of the digital content for each individual user. As such, the ever-increasing demand for cloud-based digital media access results in rapidly increasing costs for the service providers in efforts to stay ahead of the storage space requirements curve.

Embodiments of the present invention are directed to taking many copies of the same or substantially identical digital content and compressing the copies to save storage space while maintaining their status as unique and individual file copies. Because all copies of the same digital content are substantially identical, the copies can be represented using two components: a common component and an individual component. The common component may be stored once for all copies for the digital content, and multiple copies of the individual component stored with each copy of the individual component in conjunction with the common component representing one of the copies of the digital content.

In some embodiments, where the many copies of the digital content are unique but substantially identical, a common component and an individual component are extracted from each unique copy. The common component, containing the portion of digital content data that is common or identical between each unique copy, is stored once and referenced by each unique individual component, as will be described herein. On the other hand, the individual components, each being unique to one another and representing the different portions of digital content data between each unique copy is stored. As such, a plurality of individual components and one common component are stored, with each individual component sharing the common component. In some embodiments, the plurality of individual components and the one common component are stored in replacement of the actual many unique copies of the digital content, so as to reduce the amount of storage space used thereby. Each unique copy, represented by each unique individual component, can be reconstructed using at least a selected individual component and the common component and subsequently streamed to the user for consumption.

In another embodiment, a compression algorithm, such as vector quantization, is used to break digital content into the common component and an individual component, as will be further described herein, with the common component containing codebooks and the individual component containing an index file or indices of the vectors after quantization. In some instances, the encoding may result in residual files comprising residual errors that are stored with either the common or individual components. Each copy, represented by the index file, can be decoded using at least the common component and subsequently streamed to the user for consumption.

In some embodiments, a compression ratio may be customized to affect the size of the common component, individual components, and/or residual files, such that a sliding scale of compression is available to meet service provider requirements. In particular, some service providers may prefer that the individual components retain more information from the original content than compared to a highly compressed variation of the same. Other service providers may see benefit in keeping minimal information within the individual components while maintaining more information from the original content within the common component shared among the individual components for decoding.

Accordingly, in one aspect, an embodiment of the present invention is directed to one or more computer storage media storing computer-useable instructions that, when used by one or more computing devices, cause the one or more computing devices to perform operations for hosting a plurality of copies of a digital content. The operations include generating a common component and an individual component. The operations further include storing the common component and a plurality of copies of the individual component, each copy of the individual component representing a copy of the digital content.

In another embodiment of the invention, an aspect is directed to a computer-implemented method. The method includes determining a compression ratio for a plurality of copies of a digital content. The method also includes generating a common component and an individual component from one or more copies of the digital content, the components being sized based at least upon the compression ratio. The method also includes storing the common component and a plurality of copies of the individual component, each copy of the individual component representing a copy of the digital content.

A further embodiment is directed to a computerized system for hosting a plurality of copies of a digital content. The system comprises: one or more processors; and one or more computer storage media storing computer-useable instructions that, when used by the one or more processors, cause the one or more processors to: generate a common component, a plurality of residual errors of the common component, and an individual component from one or more copies of the digital content; compress the residual errors into at least one residual component; and store the common component, the at least one residual component, and a plurality of copies of the individual component, each copy of the individual component representing a copy of the digital content.

In another aspect, an embodiment of the present invention is directed to one or more computer storage media storing computer-useable instructions that, when used by one or more computing devices, cause the one or more computing devices to perform operations for hosting a plurality of unique but substantially similar copies of a digital content. The operations include extracting from the plurality of unique but substantially similar copies of the digital content a common component containing a common portion of the digital content and a plurality of individual components. Each individual component contains a unique portion of the digital content and corresponds to one of the plurality of unique but substantially similar copies of the digital content. The operations further include storing the common component and the plurality of individual components instead of storing the plurality of unique but substantially similar copies of the digital content so as to reduce hosting storage space requirements.

In another embodiment of the invention, an aspect is directed to a computer-implemented method. The method includes extracting from a plurality of unique but substantially similar copies of a digital content a common component and a plurality of individual components, each individual component being a unique portion of the digital content and corresponding to one of the plurality of unique but substantially similar copies of the digital content. The method further includes storing the common component and the plurality of individual components. Finally, a unique copy of the digital content is reconstructed using the common component and a selected individual component.

Figure 1:
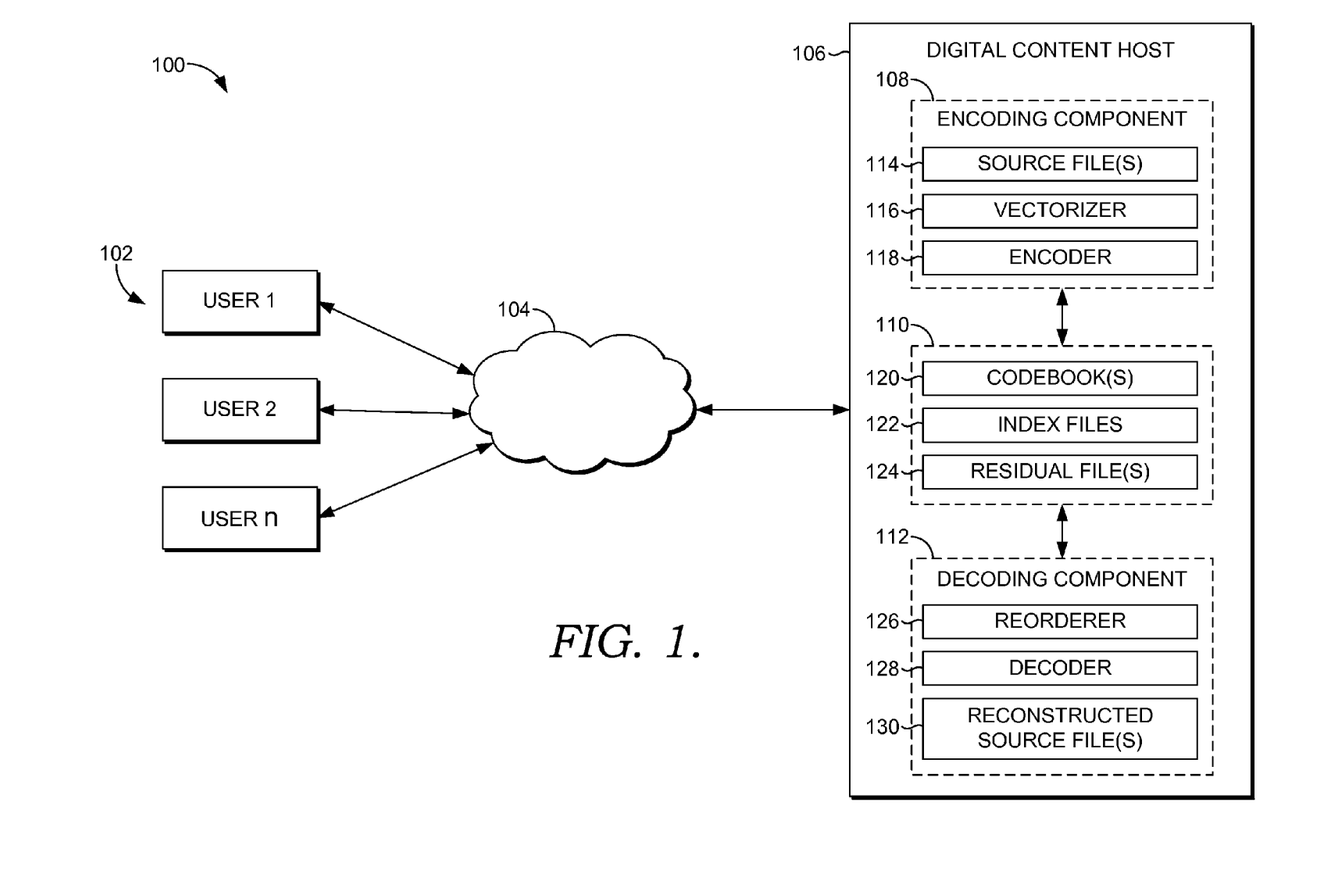
FIG. 1 is a schematic depiction of a system for hosting a plurality of copies of a digital content on one or more computing devices in accordance with various embodiments of the present invention.

Turning now to FIG. 1, a schematic depiction is provided illustrating an exemplary system 100 in which some embodiments of the present invention may be employed. It should be understood that this and other arrangements described herein are set forth only as examples. Other arrangements and elements (e.g., machines, interfaces, functions, orders, groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The system in FIG. 1 includes a plurality of users 102 that access digital content over a network 104 (e.g., the internet). In this example, a digital content host 106 provides the "cloud" storage service to the users 102, and incorporates a common copy compression algorithm to compress the hosted digital content. The host 106 may be one or more computing devices comprising two conceptual components: an encoding component 108 for breaking down the digital content into compressed components 110, and a decoding component 112 for reconstructing the compressed files 110 into the digital content for user 102 consumption. Although the description provided herein is generally directed to an encoder using a compression algorithm based on vector quantization, as can be appreciated, the systems and methods described could incorporate other types of compression algorithms capable of encoding digital content into a common component and individual components for each user.

As can be appreciated by one of ordinary skill in the art, vector quantization in compression applications comprises at least an encoder and decoder. In simple terms, a digital content is broken down into input vectors. For each input vector, the encoder reads the input vector and outputs the index of the codeword that offers the lowest amount of distortion. In some instances, the lowest distortion is determined by calculating the Euclidean distances between the input vector and each codeword in the codebook. Upon determining the codeword with the smallest Euclidean distance, the index of that codeword is provided for recordation in an index file. The decoder, on the other hand, reads the index file and replaces the recorded indices with the associated codeword, thereby rebuilding the input vectors, and ultimately reconstructing the digital content.

In more detail, the method of compression generally begins with the encoding component 108, where the source files 114 are, in essence, complete copies of the digital content. The source files 114 themselves may be in an uncompressed or compressed state (e.g., mp4, f4v, mp3, etc.). Each source file 114 is an input file that may be processed within a vectorizer 116 that breaks down the input file into input vectors. Vectorization is well-known in the art of digital media compression and encoding, and will not be described further herein. Using the common copy compression algorithm, such as vector quantization, each input vector is encoded or mapped with a codebook 120 of vectors that results in minimum error. When the input vector is encoded with the codebook, the closest codeword is found and the index of that codeword is used to produce parts of an index file 122. Upon the completion of the encoding process, all input vectors will have been encoded with at least one codebook and one index file. The codebook indices, also referred to as the index file 122, may be reproduced to represent each user copy. In other words, a copy of the index file 122 is generated, replicated, and stored for each user 102. In some instances, the index file 122 can be generated once for each user 102, each from a corresponding unique copy of the digital content source file 114, prior to storage. By using the indices of the codebook vectors instead of the input vectors, compression is achieved. In some instances, the encoding process may produce residual errors 124. The residual errors may be stored in a single residual file 124 or in separate residual files 124 corresponding to each index file 122.

The decoding component 112 is generally responsible for decompressing the source file for streaming the digital content to the user. The decoding component 112 generally comprises a decoder 128 that reconstructs the digital content by locating codewords in the codebook 120, as defined by the index file 122. Some embodiments may include a reorderer 126 component, essentially reversing the break down process previously performed by the vectorizer component 116. Each vector is reassembled into an original state (e.g., pixels, coefficients, etc.) that the input source was in, prior to encoding/ vectorization. Ultimately, the decoding component 112 performs the requisite steps to decode the compressed content into a reconstructed source file 130 for distribution to the user.

The source file 114 may be any type of digital file that is common to more than one user. For purposes of this disclosure, the source file or "input file," is a video recording having at least audio and video portions. The digital content host may be configured to host a plurality of unique source files to one or more users at any given time. Whether the content host is configured to stream the digital content or simply host the digital content for storage and/or downloading, the disclosed methods of data compression using a common copy compression algorithm may be applicable.

Figure 2:
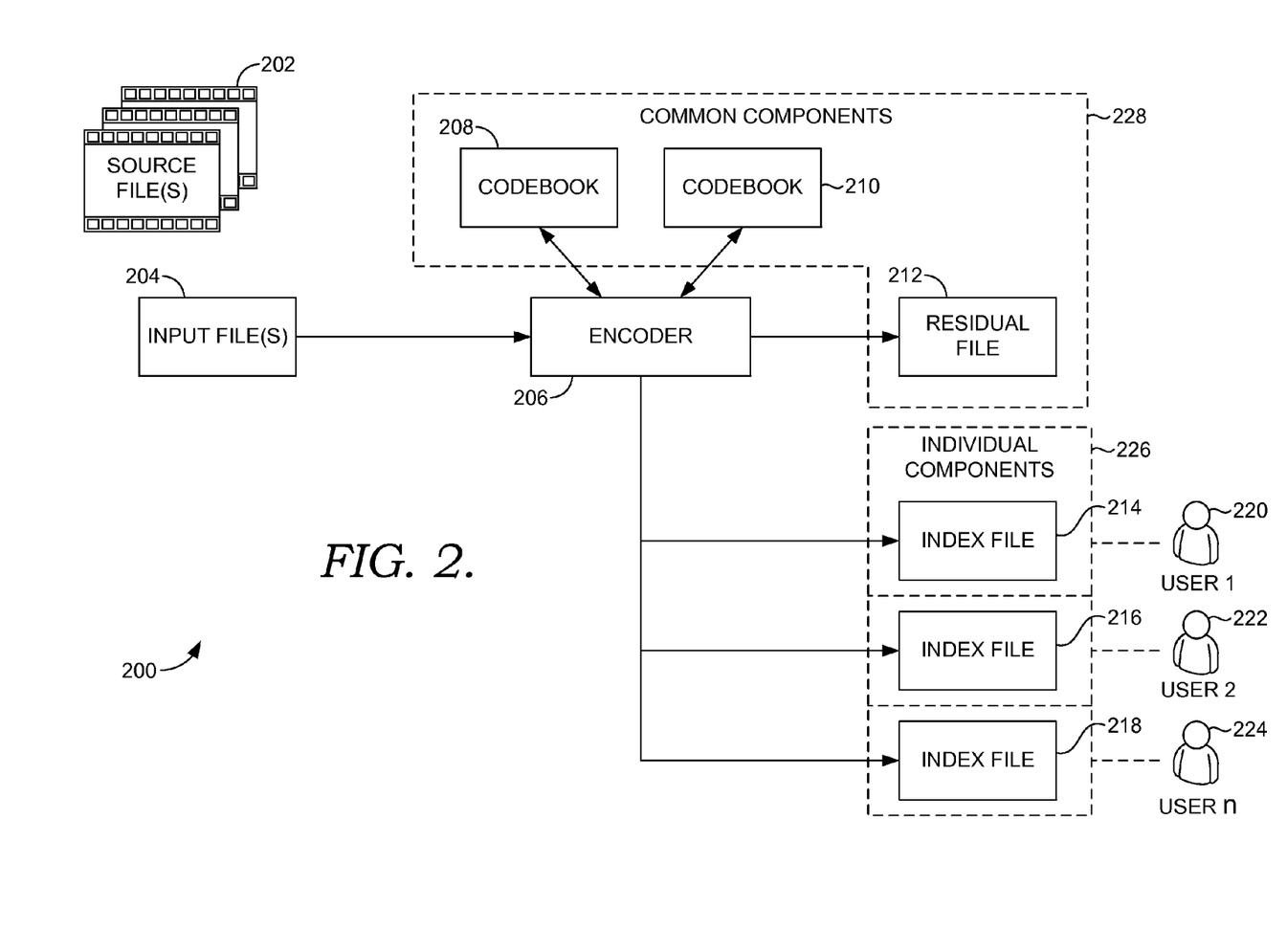
FIG. 2 is a block diagram showing a system for hosting a plurality of copies of a digital content based on a high compression ratio in accordance with an embodiment of the present invention.

Referring to FIG. 2, a block diagram is provided illustrating a system 200 for hosting a plurality of copies of a digital content based on a high compression ratio in which some embodiments of the present invention may be employed. The compression ratio can be any value that is predetermined by an administrator, input by the administrator prior to encoding, or dynamically variable depending on factors such as storage space available, source file size, or other calculated values resulting from the encoding process. The compression ratio can be a value, percentage, or fraction representative of an amount of compression to-be-performed by the computing device. In either form, the compression ratio is based on a low-to-high scale, wherein a high compression ratio maximizes the amount of overall compression for each representative copy of the digital content, and a low compression ratio minimizes the amount of overall compression for each representative copy of the digital content. In either circumstance, the high or low compression ratio will lead to substantial savings in storage space as a result of encoding the digital content using the common copy compression algorithm.

The host may have access to one or more source files 202 to be encoded for storage and hosting. The input file 204, one of the source files 202, may be in an already-compressed state or may be in an uncompressed state. In some embodiments, the input file may be partitioned into portions or vectors of type (e.g., video, audio, file headers, motion vectors, decoding parameters, quantized DCT coefficients, and other separable portions and housekeeping information). In embodiments where the input file is partitioned, each partition can serve as an individual input file and a codebook can be designed for each partition, as will be further described herein. The input file 202 is selected from one or more source files 204 to be encoded by the encoder 206. The input file 202 is subsequently "vectorized" or converted into a large set of input vectors either prior to encoding or during the encoding. Each input vector in the set is encoded by finding a smaller set of representative codebook 208 vectors that provide a good approximation to the original input space. For each type partition, an additional codebook 210 may be used.

As can be appreciated by one of ordinary skill in the art, standard vector quantization methods typically use a large representative training set for designing codebooks 208,210 and such methods may be implemented herein. In an alternative embodiment, the codebook 208 or codebooks 208,210 can be trained while encoding with the input vectors, or in other words "on the fly." For example, the process of clustering input vectors to different groups based on a distance measure and choosing the centroid of that group as the codebook vector is used for training. However, in some embodiments, when a distance measure is above a certain threshold, a new codebook vector can be added. In other embodiments, residual errors may result as part of the encoding process.

In some embodiments, when residual errors are produced, the errors may optionally be stored, one or more per residual file 212. In further embodiments, the residual errors can be compressed with a smaller codebook vector quantization, or with a traditional entropy coding technique such as Huffman coding, with the residual errors stored one or more per file.

The index file 214, including the indices of the vectors from the codebooks 208,210, represents the unique nature of the input file 204. In the illustrated embodiment, the index file 214, including indices of the codebook vectors, is replicated in each copy 216,218 of the index file 214. The individual components 226, also illustrated as the collection of index files 214,216,218, corresponds to a unique user 220,222,224, respectively. When the unique user initiates a request to access their copy of the digital content (copy or instance of the input file 204), the user's corresponding index file is used in conjunction with the common components 228 for decoding and reconstruction of the input file 204. The index file 214 and respective copies thereof 216,218 may include indices that vary in size depending on vector length and/or codebook size. In some embodiments, the vector length and codebook size may also determine the compression ratio and the encoding complexity. It is within the scope of this invention to consider customizable vector lengths and codebook sizes for altering the compression ratio, or to simplify the customization of compression ratio determination from predetermined or direct administrator input values, as previously discussed.

In embodiments where the system 200 is configured for hosting a plurality of copies of a digital content based on a high compression ratio, the encoder 206 compresses the input file 204 into a common component 228 and a plurality of individual components 226. In some embodiments, one or more codebooks 208,210 may be created and utilized depending on whether the input file 204 is partitioned into portions of varying type. In other embodiments, the encoding process can produce residual errors which may be stored collectively over one or more residual files 212. In the illustrated embodiment, a high compression ratio results in an encoding process that produces a single residual file 212 that collects the residual errors to be shared amongst the individual components 226 when decoding. In some embodiments, altering the size of the codebooks 208,210, can change the size of the individual components 226. Having a high compression ratio, codebook 208,210 size and vector lengths are maximized and paired with a single residual file 212 for making up the common components 228, thereby resulting in minimally sized individual components 226 and thus minimal use of storage space for representing each unique copy of the digital content. In some embodiments, the highest compression ratio results in individual components having data representing only portions of data unique to its corresponding copy of the digital content, while the common component has data representing only the portion of data common to all copies of the digital content.

Figure 3:
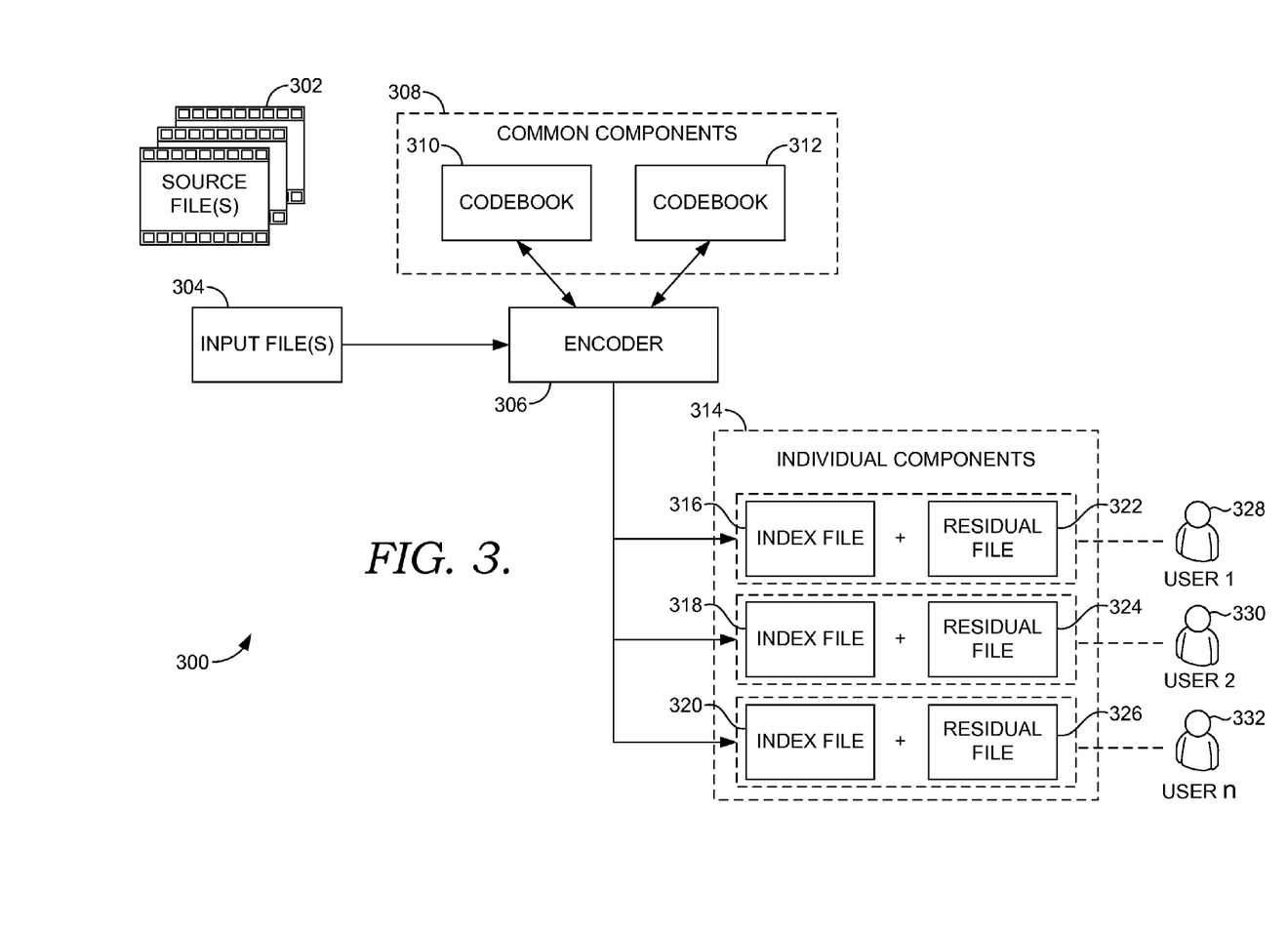
FIG. 3 is a block diagram showing a system for hosting a plurality of copies of a digital content based on a low compression ratio in accordance with an embodiment of the present invention.

Referring now to FIG. 3, a system 300 is configured for hosting a plurality of copies of a digital content based on a low compression ratio. As previously described, the host may have access to one or more source files 302 to be encoded for storage and hosting. The input file 304, one of the source files 302, may be in an already-compressed state or may be in an uncompressed state. In some embodiments, the input file 304 may be partitioned into portions or vectors of type (e.g., video, audio, file headers, motion vectors, decoding parameters, quantized DCT coefficients, and other separable portions and housekeeping information). In embodiments where the input file 304 is partitioned, each partition can serve as an individual input file and a codebook can be designed for each partition.

As described hereinabove, varying levels of compression are achieved by changing the arrangement and format of the common components 308. By way of example, the size of the individual components 314, particularly the index files 316, 318,320, are a direct function of the codebook 310,312 sizes. Moreover, an input file 304 may produce residual errors during encoding (i.e., when using lossy compression schemes) that can be stored as one or more common components 308, or alternatively as one or more residual files 322,324,326. In the illustrated embodiment, the system 300 utilizes a low compression ratio for minimizing the amount of compression used for all individual components 314. An exemplary system for maintaining individual components with minimal compression has a common component comprising one or more codebooks 310,312 and individual components 314 each comprising index files 316,318,320 and corresponding residual files 322,324,326. As such, this conservative approach facilitates the maintenance of individual copies of information least removed from the input file, but still representative of the input file for each user 328,330,332.

Figure 4:
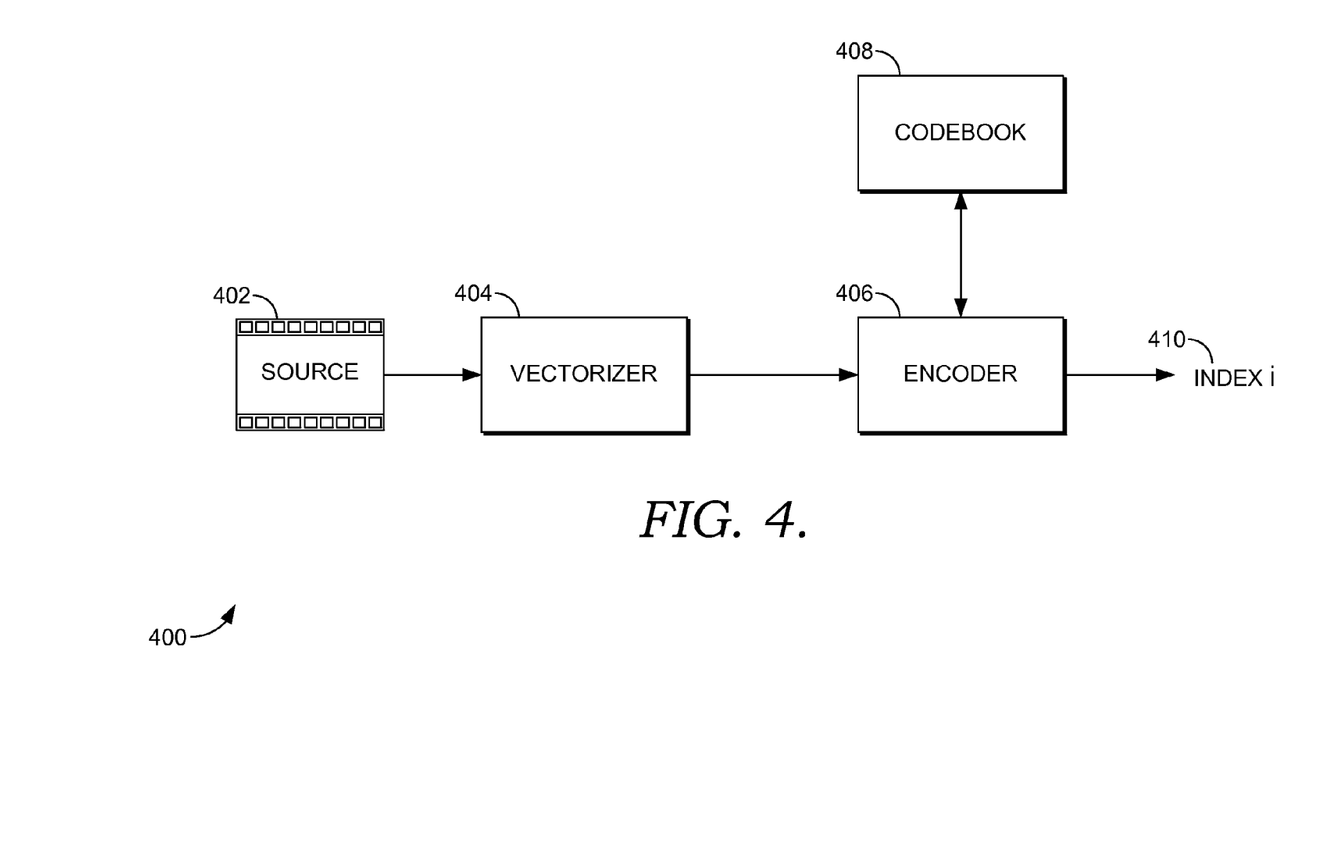
FIG. 4 is a block diagram showing exemplary components of a system for encoding a digital content according to various embodiments of the present invention.

Turning now to FIG. 4, a block diagram illustrates components of the process for compressing a digital content in a system for hosting a plurality of copies of the digital content in accordance with embodiments of the invention. The encoding process 400 begins by reading a source file 402, representing a digital content, and transforming the source file into input vectors using the vectorizer 404. The vectorizer 404, which includes the process for source file to vector transformation, is well known in the art as "vectorization" and will not be described further herein. The source file 402 in input vector form can now be read by the encoder 406. Using a compression algorithm, such as vector quantization, the encoder 406 maps the input vectors with a codebook 408 of vectors resulting in minimum error. Compression is achieved by using the indices of the codebook 408 vectors instead of the input vectors. The indices are stored in an index file 410, the index file representing one copy of the digital content in a compressed state. The index file 410 can then be copied as many times as necessary, such that each copy of the index file represents a unique copy of the digital content.

Figure 5:
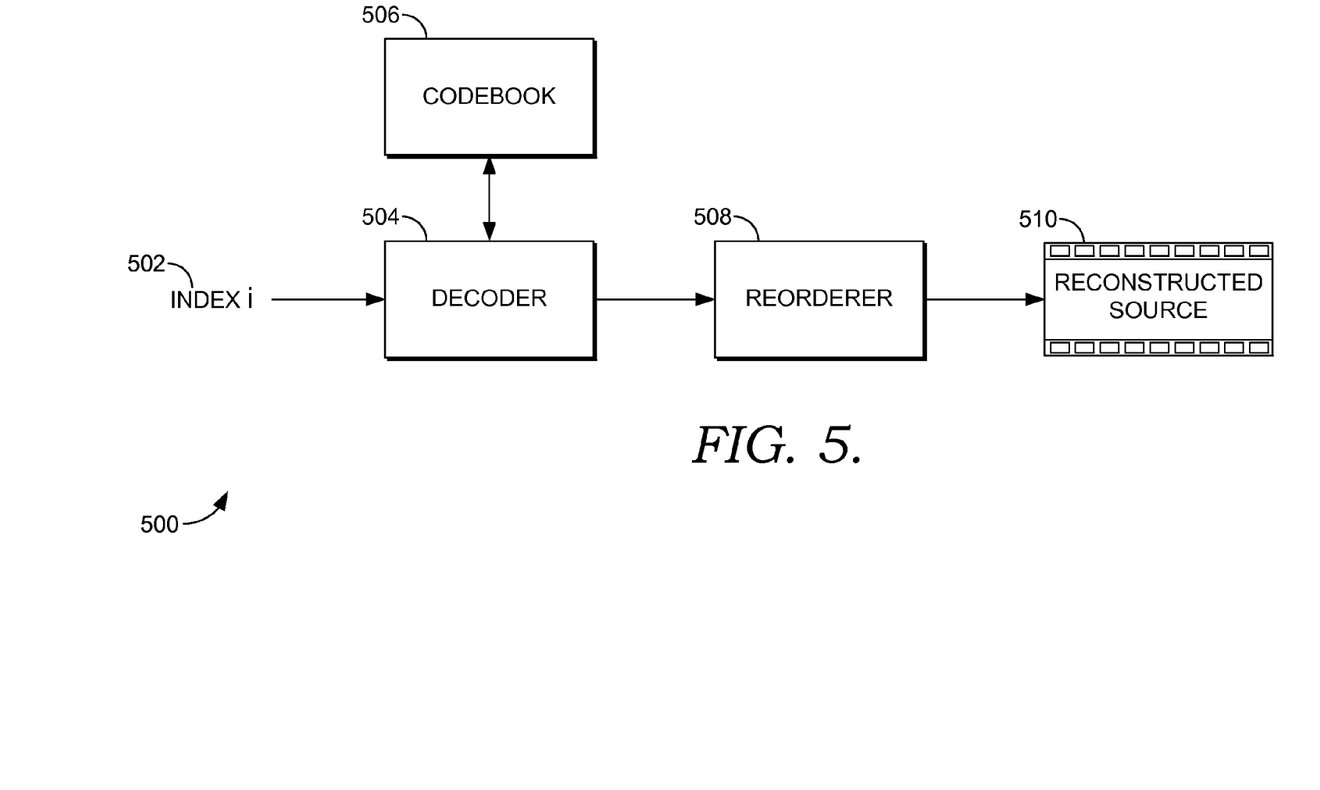
FIG. 5 is a block diagram showing exemplary components of a system for decoding a digital content according to various embodiments of the present invention.

With regards to decompression of the index file, a block diagram illustrating the components of the process for decompressing the digital content is shown in FIG. 5. The decoding process 500 begins by reading the index file 502 with the decoder 504. The decoder 504 takes the index file 502, which references indices of the codebook 506 vectors, and looks up the references to begin reordering of the source file. As each index reference to a codebook vector is read from the index file 502, the decoder 504 takes codebook vectors and uses the recovered information to reconstruct the source file. Some embodiments may include a reorderer 508 for reordering the codebook indices after each decoding operation, improving lookup efficiency. The reconstructed source 510 may be partially or completely decoded or decompressed for consumption by the user. Partial reconstruction may be applicable in embodiments where decoding is performed "on the fly." The process of decoding an index file using a codebook, particularly with respect to decoding in vector quantization applications, is well known in the art and additional details will not be described further herein.

Figure 6:
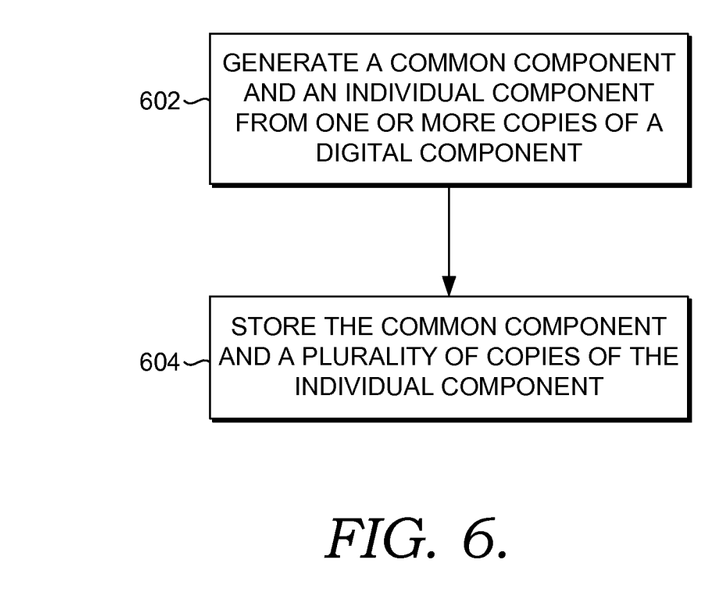
FIG. 6 is a flow diagram showing a method for facilitating performance of encoding component functionality according to various embodiments of the present invention.

Turning now to FIG. 6, a flow diagram is provided that illustrates a method for hosting a plurality of copies of a digital content. As shown at block 602, a common component and an individual component from one or more copies of the digital content are generated. Subsequently, at block 604, the common component and a plurality of copies of the individual component is stored, with each copy of the individual component representing a copy of the digital content.

The individual components can also be sized based at least upon a compression ratio. Each of the plurality of individual components is stored in memory and represents each of the plurality of copies of the digital content for each user. The compression ratio may be predetermined and stored in memory for use, calculated in real-time as a result of system demands (i.e., available storage space), or input by an administrator of the system. In some embodiments, the compression ratio may be determined by a codebook size defined by the number of code vectors and a code vector length for each codebook being used in the encoding process. The compression ratio may determine the amount of compression applied to each user's individual copy or representation thereof. Some administrators may prefer maximum savings of storage space, requiring a high compression ratio. In other circumstances, the administrator may still prefer substantial savings of storage space while maintaining significant amounts of information representative of each user's individual copy or representation thereof, thereby prompting a lower compression ratio.

Figure 7:
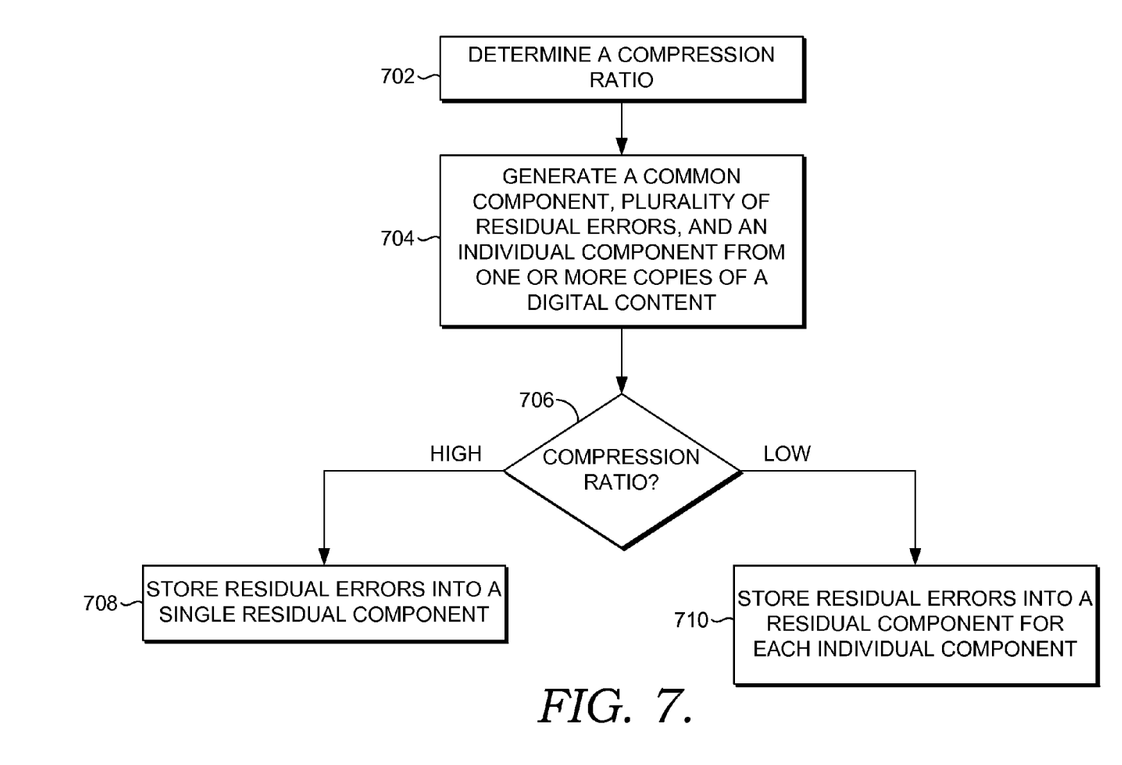
FIG. 7 is a flow diagram showing a method for facilitating performance of encoding component functionality in accordance with a compression ratio provided by a user according to one embodiment of the present invention.

In further embodiments, the compression ratio may affect how the system handles the residual errors, as illustrated in FIG. 7. More particularly, the residual errors can either be stored in a single residual file to be shared between the plurality of index files for decoding, replicated and stored in a residual file corresponding to each of the plurality of index files for decoding, or uniquely encoded for each of the plurality of index files for decoding. In more detail, residual errors can occur as a result of encoding a previously compressed digital content, but may also occur as a result of encoding uncompressed digital content. As described above, residual errors are generally produced when using a lossy compression scheme, such as vector quantization, for encoding the digital content. Depending on the amount of compression the administrator requires for each representative copy of the digital content, residual errors can be configured as a common component shared by each representative copy or index file, or as unique files that correspond to each representative copy or index file.

The application of vector quantization in compression applications provides that a codebook includes a plurality of code vectors, where each code vector provides an approximation to at least one of the plurality of input vectors. The individual components each comprise indices that correspond to at least one of the plurality of code vectors for decoding. Standard methods of vector quantization generally apply a large representative training set that is used for designing the codebooks. In some embodiments of the present invention, the codebook design can use all input vectors from source files for training. By way of background, input vectors are typically clustered to different groups based on a distance measure. A centroid of that group is determined as the codebook vector and is typically used for training. As such, centroid calculation results in generating codebook vectors. New codebook vectors are typically added by splitting codebook vectors in some fashion (i.e., using random perturbation). Based on the newly added codebook vectors, a training set is partitioned, leading to new centroids which become the new codebook vectors. This process is generally repeated until the required codebook size is reached. In some embodiments, training of codebook vectors can be performed during the encoding process, or in other words "on the fly", such that codebook vectors are either updated or added during encoding. For example, centroids of a group of input vectors may be adjusted as new input vectors are measured in the codebook.

As centroids are adjusted, codebook vectors are updated. Moreover, as input vector distances from centroids exceed a predetermined distance threshold, new codebook vectors may be added and centroids may be readjusted in real-time.

In some embodiments, compression of a digital content can be performed by partitioning the digital content file into vectors of type, such as audio, video, file headers, and/or other housekeeping information. Videos can be further partitioned into portions using motion vectors, decoding parameters, quantized DCT coefficients, and more. Application of such partitioning methods may be readily applied to audio and data files as well. Partitioning and encoding the digital content will result in individual codebooks for each partition of the digital content. In further embodiments, a partitioned digital content having been encoded using the common copy compression algorithm will have separate codebooks and possibly separate index files for each data type. In such an embodiment, separate codebooks for each data type may be designed for a set of files identified to share common characteristics (e.g., same encoding source, same bit rates, etc.).

Referring now to FIG. 7, a flow diagram is provided that illustrates a method for hosting a plurality of copies of a digital content. As shown at block 702, a compression ratio for copies of a digital content is determined. Subsequently, at block 704, a common component, a plurality of residual errors, and an individual component are generated from one or more copies of a digital content. The individual components are sized based at least upon the compression ratio. Each of the plurality of individual components is stored in memory and represents each of the plurality of copies of the digital content for each user. As described above, the compression ratio may determine the size of the common component and individual components. Alternatively, in some embodiments, the compression ratio may affect the configuration and handling or storage of residual errors produced during the encoding process. During the encoding process, if the compression ratio is determined to be high 708, the system may be configured to store the residual errors into a single residual component or file to be shared by each of the individual components for decoding. In the alternative, if the compression ratio is determined to be low 710, the system may be configured to store the residual errors into a residual component or file for each of the individual components for decoding. It is considered that the desire to maintain the maximum amount of information for each representative copy of the digital content will be configured to have a low compression ratio, resulting in smaller codebooks, larger index files, and possibly having residual components for each representative copy or index file. It is within the scope of the invention to consider that the residual components or files can be alternatively configured such that even with a low compression ratio, a common residual component or file is used by each representative copy or index file.

Figure 8:
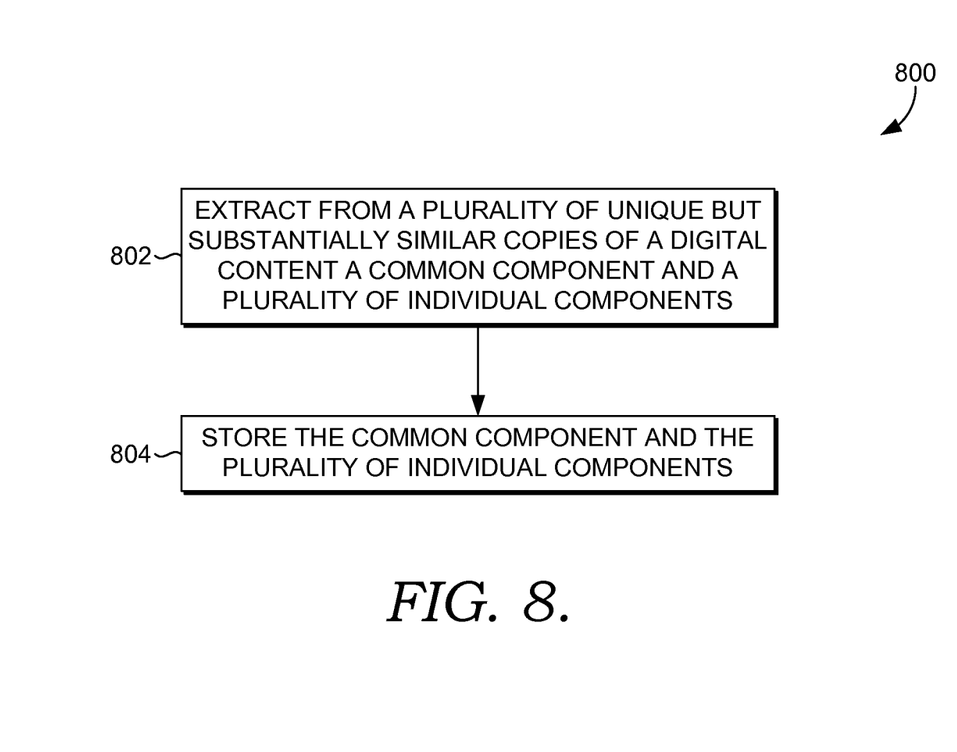
FIG. 8 is a flow diagram showing a method for hosting a plurality of unique but substantially similar copies of a digital content.

Referring now to FIG. 8, a flow diagram is provided that illustrates a method for hosting a plurality of unique but substantially similar copies of a digital content. As shown at block 802, a common component and a plurality of individual components are extracted from a plurality of unique but substantially similar copies of a digital content. The common component contains a common portion of the digital content, while each individual component contains a unique portion of the digital content and corresponds to one of the plurality of unique but substantially similar copies of the digital content. Subsequently, at block 804, the common component and the plurality of individual components are stored. The single, shared common component, and the plurality of individual components, all sized considerably smaller than the sum of each digital content copy, is stored in replacement of all digital content copies so as to significantly reduce the amount of storage space used thereby.

Figure 9:
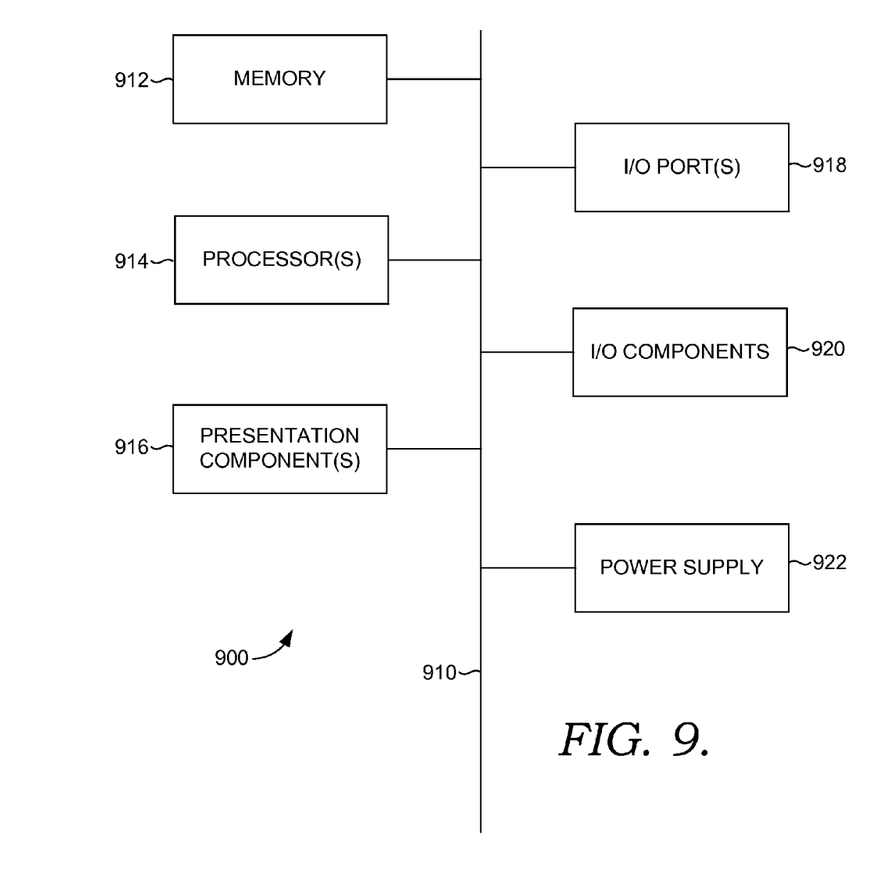
FIG. 9 is a block diagram of an exemplary computing environment suitable for use in implementing embodiments of the present invention.

Having described embodiments of the present invention, an exemplary operating environment in which embodiments of the present invention may be implemented is described below in order to provide a general context for various aspects of the present invention. Referring initially to FIG. 9 in particular, an exemplary operating environment for implementing embodiments of the present invention is shown and designated generally as computing device 900. Computing device 900 is but one example of a suitable computing environment and is not intended to suggest any limitation as to the scope of use or functionality of the invention. Neither should the computing device 900 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 9, computing device 900 includes a bus 910 that directly or indirectly couples the following devices: memory 912, one or more processors 914, one or more presentation components 916, input/output (I/O) ports 918, input/output components 920, and an illustrative power supply 922. Bus 910 represents what may be one or more busses (such as an address bus, data bus, or combination thereof). Although the various blocks of FIG. 9 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventor recognizes that such is the nature of the art, and reiterates that the diagram of FIG. 9 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 9 and reference to "computing device."

Computing device 900 typically includes a variety of computer-readable media. Computer-readable media can be any available media that can be accessed by computing device 900 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 900. Computer storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 912 includes computer-storage media in the form of volatile and/or nonvolatile memory. The memory may be removable, non-removable, or a combination thereof. Exemplary hardware devices include solid-state memory, hard drives, optical-disc drives, etc. Computing device 900 includes one or more processors that read data from various entities such as memory 912 or I/O components 920. Presentation component(s) 916 present data indications to a user or other device. Exemplary presentation components include a display device, speaker, printing component, vibrating component, etc.

I/O ports 918 allow computing device 900 to be logically coupled to other devices including I/O components 920, some of which may be built in. Illustrative components include a microphone, joystick, game pad, satellite dish, scanner, printer, wireless device, etc. The I/O components 920 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 900. The computing device 900 may be equipped with depth cameras, such as stereoscopic camera systems, infrared camera systems, RGB camera systems, touchscreen technology, and combinations of these, for gesture detection and recognition. Additionally, the computing device 900 may be equipped with accelerometers or gyroscopes that enable detection of motion. The output of the accelerometers or gyroscopes may be provided to the display of the computing device 900 to render immersive augmented reality or virtual reality.

As can be understood, embodiments of the present invention provide for, among other things, hosting a plurality of copies of a digital content. The present invention has been described in relation to particular embodiments, which are intended in all respects to be illustrative rather than restrictive. Alternative embodiments will become apparent to those of ordinary skill in the art to which the present invention pertains without departing from its scope.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

What is claimed is:

1. One or more non-transitory computer storage media storing computer-useable instructions that, when used by one or more computing devices, cause the one or more computing devices to perform operations for hosting a plurality of copies of a digital content, the operations comprising:
   determining a compression ratio for the plurality of copies of the digital content;
   generating a common component an individual component, and at least one residual component from one or more copies of the digital content, the components sized based at least upon the compression ratio, wherein the at least one residual component includes residual errors of the common component required for reconstructing; and
   storing the common component and a plurality of copies of the individual component, each copy of the individual component representing a copy of the digital content.

2. The one or more computer storage media of claim 1, the operations further comprising:
   reconstructing a copy of the digital content using the common component and a selected copy of the individual component.

3. The one or more computer storage media of claim 2, wherein the reconstructing is initiated upon receiving a request to provide the copy of the digital content, and wherein the selected copy of the individual component is identified based upon the request.

4. The one or more computer storage media of claim 1, wherein the individual component is an encoded version of the digital content and the common component is a codebook for decoding the individual component.

5. The one or more computer storage media of claim 4, wherein the codebook is generated as the digital content is encoded.

6. The one or more computer storage media of claim 4, wherein the individual component is generated using vector quantization.

7. The one or more computer storage media of claim 1, wherein the digital content includes at least audio and video portions, and further comprising the step of partitioning the digital content into at least the audio and video portions prior to generating the common component and the individual component.

8. A computer-implemented method for hosting a plurality of copies of a digital content, the method comprising:
   determining a compression ratio for the plurality of copies of the digital content;
   generating a common component an individual component, and at least one residual component from one or more copies of the digital content, the components sized based at least upon the compression ratio, wherein the at least one residual component includes residual errors of the common component required for reconstructing; and
   storing the common component and a plurality of copies of the individual component, each copy of the individual component representing a copy of the digital content.

9. The method of claim 8, further comprising:
   reconstructing a copy of the digital content using the common component and a selected copy of the individual component.

10. The method of claim 9, wherein the reconstructing is initiated upon receiving a request to provide the copy of the digital content, and wherein the selected copy of the individual component is identified based upon the request.

11. The method of claim 8, wherein the digital content includes at least audio and video portions, and further comprising the step of partitioning the digital content into at least the audio and video portions prior to generating the common component and the individual component.

12. The method of claim 11, wherein each copy of the digital content further includes an element having at least one of file headers, motion vectors, decoding parameters, and quantized DCT coefficients.

13. The method of claim 8, wherein the individual component is an encoded version of the digital content and the common component is a codebook for decoding the individual component.

14. The method of claim 8, wherein the individual component is generated using vector quantization.

15. A computerized system for hosting a plurality of copies of a digital content, the system comprising:
one or more processors; and
one or more non-transitory computer storage media storing computer-useable instructions that, when used by the one or more processors, cause the one or more processors to:
generate a common component, a plurality of residual errors of the common component, and an individual component from one or more copies of the digital content;
organize the residual errors into at least one residual component; and
store the common component, the at least one residual component, and a plurality of copies of the individual component, each copy of the individual component representing a copy of the digital content.

16. The computerized system of claim 15, wherein the residual errors are compressed into the at least one residual component using vector quantization or traditional entropy coding techniques.

17. The computerized system of claim 15, wherein the instructions further cause the one or more processors to:
reconstruct a copy of the digital content using the common component, the at least one residual component, and a selected copy of the individual component.

18. The computerized system of claim 17, wherein the instructions further cause the one or more processors to:
determine a compression ratio provided by a user;
if the compression ratio is at a highest level, store the plurality of residual errors into a single residual component to be shared by each copy of the individual component for reconstruction; and
if the compression ratio is at a lowest level, store the plurality of residual errors into a plurality of copies of the residual component, each copy of the residual component corresponding to a copy of the individual component for reconstruction.

* * * * *